(12) United States Patent
Umemoto et al.

(10) Patent No.: US 6,168,968 B1
(45) Date of Patent: *Jan. 2, 2001

(54) METHOD OF FABRICATING INTEGRATED THIN FILM SOLAR CELLS

(75) Inventors: Akimasa Umemoto, Sakurai; Susumu Kidoguchi, Kitakatsuragi-gun, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/030,005

(22) Filed: Feb. 25, 1998

(30) Foreign Application Priority Data

Feb. 27, 1997 (JP) .................................................. 9-043525

(51) Int. Cl.⁷ .................................................. H01L 21/00
(52) U.S. Cl. .......................... 438/96; 438/583; 438/584; 438/587; 438/591; 136/244; 136/255; 257/458
(58) Field of Search .............................. 438/96; 136/244, 136/255, 259, 258; 156/643; 257/458; 219/121.69

(56) References Cited

U.S. PATENT DOCUMENTS

| 5,039,353 | * | 8/1991 | Schmitt | 136/249 |
| 5,453,134 | * | 9/1995 | Arai et al. | 136/244 |
| 5,516,704 | * | 5/1996 | Yoshida | 437/2 |
| 5,626,686 | * | 5/1997 | Yoshida | 136/24 |
| 5,956,572 | * | 5/1999 | Kidoguchi et al. | 438/96 |

FOREIGN PATENT DOCUMENTS

| 63-003470 | 1/1988 | (JP) . |
| 63-215390 | 9/1988 | (JP) . |
| 8-056004 | 2/1996 | (JP) . |
| 8-056005 | 2/1996 | (JP) . |

* cited by examiner

Primary Examiner—Matthew Smith
Assistant Examiner—Granvill Lee
(74) Attorney, Agent, or Firm—Nixon & Vanderhye P.C.

(57) ABSTRACT

A method of fabricating an integrated thin film solar cell includes the steps of: forming a transparent conductive electrode layer and an amorphous semiconductor photoelectric conversion layer successively on a light-transmitting substrate; forming a rear electrode on the amorphous semiconductor photoelectric conversion layer; and patterning the rear electrode layer by applying a beam of a fourth harmonic generation from an Nd-YAG laser onto the rear electrode layer to form a rear electrode.

11 Claims, 11 Drawing Sheets

METHOD OF FABRICATING INTEGRATED THIN FILM SOLAR CELLS

CROSS-REFERENCES TO RELATED APPLICATIONS

This application is related to Japanese Patent Application No. HEI 09-043525 filed on Feb. 27, 1997 whose priority is claimed under 35 USC §119, the disclosure of which is incorporated herein by reference in its entirety.

BACKGROUND OF THE INVENTION

1. Field of the Invention

The present invention relates to a method of fabricating integrated thin film solar cells. More particularly, the present invention relates to a process of patterning a rear reflection electrode layer in an integrated thin film solar cell.

2. Description of the Related Arts

The thin film solar cell has an integrated structure in which a plurality of photoelectric power generation elements (unit cells) typically including a transparent electrode layer, an amorphous semiconductor photoelectric conversion layer and a rear reflection electrode layer of metal, these layers are laminated in this order on a light-transmitting insulating substrate of glass or the like. The unit cells are electrically connected in series for achieving a redetermined photoelectric power generation in the thin film solar cell. Accordingly, each layer is subjected to a patterning process after the formation of the layer.

Here, a current loss due to a sheet resistance of the transparent electrode layer is accumulated as a series resistance component loss (series loss) of the thin film solar cell and lowers a curve factor value (F.F.) of an I-V characteristics of the solar cell. Therefore, the patterning process needs to be performed so that the unit cells are electrically connected in series without increasing the series resistance component loss. For performing the patterning process, a laser scribing method is established which is advantageous in terms of the number of steps and the costs as compared with the mask evaporation or photoetching method.

The patterning process employing the laser scribing method makes use of the laser beam characteristics having a high energy density and being excellent in directivity and is suitable for fine patterning process. The laser to be used for the patterning process may be, for example, a YAG laser, an excimer laser or the like, and its wavelength and intensity may vary depending on the intended use thereof. Also, it is possible to perform selective patterning process by utilizing the difference in light absorptivity of an object to be processed. Especially, a YAG laser is often used because of its low running costs, simple apparatus construction and elimination of high pressure corrosive gas from the process.

A conventional process for fabricating an integrated thin film solar cell is as follows. First, a transparent electrode layer formed on a light-transmitting insulating substrate is segmented into a plurality of elongate strips for isolation (a first scribing step). Then, an amorphous photoelectric conversion layer is deposited on the resulting substrate, and a patterning process is performed for segmenting only the amorphous photoelectric conversion layer at a position shifted from a first scribing line without damaging the transparent electrode layer (a second scribing step). Subsequently, a rear reflection electrode layer is deposited on the resulting substrate and a patterning process is performed for segmenting the rear reflection electrode layer at a position shifted from a second scribe line to a side opposite to the first scribe line (a third scribing step).

Generally, a laser scribing method is employed in the patterning process for segmenting the transparent electrode film layer (the first scribing step). This is due to the fact that it is possible to form trenches easily through scanning a surface of the object to be processed with a laser beam by moving the object or the laser beam, so that the manufacturing process is simplified and also it is possible to prevent decrease in the effective power generation area because the trenches are formed to have a narrow width of 100 $\mu$m or less.

The patterning process for segmenting only the amorphous photoelectric conversion layer (the second scribing step) makes use of the fact that the light absorption of the transparent electrode layer and the amorphous photoelectric conversion layer varies greatly depending on a wavelength of light. For example, a beam of a secondary harmonic generation (SHG having a wavelength of 0.532 $\mu$m) of the Nd-YAG laser is applied, whereby the beam is transmitted through the transparent electrode layer without damaging it and is absorbed by the amorphous photoelectric conversion layer to remove a portion of an amorphous photoelectric conversion layer by ablation so as to form the trenches.

The patterning process for segmenting the rear reflection electrode layer (the third scribing step) is performed by one of the following methods.

First method employs applying the beam of the second harmonic generation (SHG) of the Nd-YAG laser from the light-transmitting insulating substrate side to allow the beam to be absorbed by the amorphous photoelectric conversion layer to remove a portion of the rear reflection electrode layer together with a portion of the amorphous photoelectric conversion layer by ablation so as to form the trenches.

Second method employs applying a laser beam directly onto the rear reflection electrode layer to remove a portion of the layer.

Third method employs printing a resist on the rear reflection electrode layer by screen printing method to remove a portion of the rear reflection electrode layer by chemical etching.

Among the above-described three patterning steps (the first, second and third scribing steps), the most problematic one is the patterning process for segmenting the rear reflection electrode layer (i.e., the third scribing step). This is due to the following reason. The patterning process for segmenting the rear reflection electrode layer is performed as the final step after each layer of the integrated thin film solar cell is formed by deposition. Therefore, by employing the third method, a pressure is exerted on the substrate by contact with a mask or a squeegee at the time of screen printing, causing a very small short circuit (shunt path leak) in the surface of the thin film solar cell and lowering the curve factor value (F.F.) of the I-V characteristics of the solar cell.

By employing the first method, a short circuit occurs by contact of adjacent rear reflection electrodes, which are separated by the patterning, with each other due to burrs (flashes) of Al or Ag constituting the rear reflection electrode layer. A short circuit occurs also because a rear transparent conductive layer (for example, ZnO or ITO) formed between the rear reflection electrode layer and the amorphous photoelectric conversion layer for improvement of sensitivity in the longer wavelength adheres to the trenches by becoming a conductive sublimate when a portion of the rear reflection electrode layer is blown away by ablation of the amorphous photoelectric conversion layer.

The rear reflection electrode layer is made of Al or Ag and is highly reflective as well as being highly conductive.

Therefore, the second method has a drawback that the laser beam is reflected by the rear reflection electrode layer so that the energy of the laser beam is not utilized effectively in the patterning process.

FIG. 3 shows a relationship between the wavelength of the laser beam and the reflectivity. Al and Ag show a high reflectivity of 80% or more with respect to the laser beam having a wavelength of 0.4 $\mu$m or more. Therefore, when a beam of a fundamental harmonic generation (wavelength of 1.064 $\mu$m) of the Nd-YAG laser is applied for patterning, almost all of the beam is reflected by the rear reflection electrode layer. If the patterning process is conducted with high laser power in order to compensate for the energy loss caused by the reflection, the beam is absorbed indiscriminately by the underlying amorphous photoelectric conversion layer and the transparent electrode layer because the wavelength lies in a near infrared region. Accordingly, it is impossible to conduct a selective film patterning process, and may cause problems such as severance of all the layers and short circuit due to fusion of the rear reflection electrode layer by local heating.

Even if the beam of the second harmonic generation (0.532 $\mu$m) of the Nd-YAG laser is applied, the reflectivity of Al or Ag at this wavelength is more than 90% although there may be some difference in the reflectivity depending on the surface shape. As a result, this will be the same as the case of applying the beam of the fundamental harmonic generation from Nd-YAG laser.

Japanese Unexamined Patent Publication No. Hei 8(1996)-56004 discloses a method for conducting a patterning process for forming trenches by using the beam of the second harmonic generation from the Nd-YAG laser on the rear reflection electrode layer formed of Ag. In this case, the beam of the second harmonic generation is selected because it shows a large absorptivity in the amorphous photoelectric conversion layer formed of a-Si and a low absorptivity in the transparent electrode layer and in the light-transmitting insulating substrate. Although there is no description of the reflection of the laser beam by Ag, it is understood that almost all of the applied laser beam is reflected because Ag shows a high reflectivity of 90% or more for the YAG laser having a wavelength of 0.532 $\mu$m, as shown in FIG. 3.

Japanese Unexamined Patent Publication No. Sho 63(1988)-215390 proposes a method of conducting a patterning process for forming trenches with a KrF excimer laser having a wavelength of 0.248 $\mu$m on the rear reflection electrode layer formed of Al. This Publication describes that good scribing is achieved if the laser beam pulse is applied for more than once and less than 6 times, that it is not possible to isolate if the laser beam is applied only once, and that the underlying layers are damaged if the laser beam is applied for 6 times or more. This seems to be due to the reflection of the employed laser beam on the Al surface. However, no reference is made to the reflection of the laser beam.

As is apparent from FIG. 3, Al shows a high reflectivity of 90% or more with respect to the KrF excimer laser having a wavelength of 0.248 $\mu$m. Therefore, Al is not sufficiently removed by one application of the laser beam, but it is possible to remove Al sufficiently by application of the laser beam for two times or more to provide a high energy. On the other hand, by application of the laser beam for six times or more, it seems that a shunt path leak is generated because of a damage due to direct application of the high energy laser beam to the exposed amorphous photoelectric conversion layer and also because of a damage such as crystallization of the amorphous material due to the influence of heat.

Here, none of the above-mentioned publications describe anything about the processing thresholds of the rear reflection electrode layer and the amorphous photoelectric conversion layer. Further, the publications do not refer to selective processing of the rear reflection electrode layer in view of the processing thresholds.

Numerous attempts have been made to perform patterning processing of the rear reflection electrode layer with a laser beam. However, as noted above, there are numerous problems due to the fact that metals reflect almost all of the laser beam. Moreover, little is known on a correlation between the condition of the laser beam (such as a surface to be patterned output, a processing speed, and a Q frequency of the YAG laser) and a physical condition of each layer in an integrated thin film solar cell to be processed. Therefore, it is not easy to fabricate excellent thin film solar cells with good reproducibility by employing a conventional method of controlling the process of patterning the rear reflection electrode layer only by adjusting the condition of the laser beam under an unfavorable condition in which almost all of the laser beam is reflected.

SUMMARY OF THE INVENTION

The present invention provides a method of fabricating an integrated thin film solar cell, comprising the steps of: forming a transparent conductive electrode and an amorphous semiconductor photoelectric conversion layer successively on a light-transmitting substrate; forming a rear electrode layer on the amorphous semiconductor photoelectric conversion layer; and patterning the rear electrode layer by applying a beam of a fourth harmonic generation from an Nd-YAG laser onto the rear electrode layer to form a rear electrode.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1A:
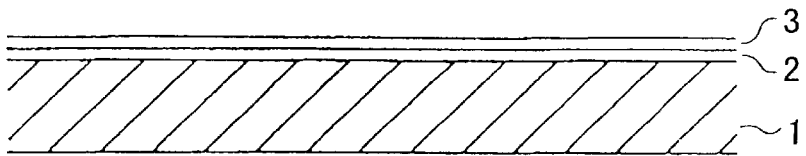
FIGS. 1(a) to 1(f) are views showing cross sections of an integrated thin film solar cell for explaining a manufacturing process according to an embodiment of the present invention.

Integrated thin film solar cell to be fabricated in accordance with the fabrication method of the present invention essentially includes a plurality of unit cells which comprises transparent conductive electrodes, amorphous semiconductor photoelectric conversion layers and rear electrodes which are provided in this order on a light-transmitting substrate.

The light-transmitting substrate according to the present invention has an insulating surface, and examples thereof include a glass substrate and resin substrates such as of polyethylene and polycarbonate. The light-transmitting substrate may be subjected to a predetermined surface texturing treatment so that the applied light can be scattered on the surface of the light-transmitting substrate. The texturing treatment is achieved by any of various conventional methods such as sand blasting and laser beam radiation. The light-transmitting substrate preferably has a thickness of about 0.1 mm to about 10 mm, a refractive index of about 0.5 to about 2.5 and a light transmittance of about 60% to about 100%, for example. The light-transmitting substrate may be formed an insulating film such as of silicon dioxide on its surface.

The transparent conductive electrode is formed by depositing a transparent conductive layer on the light-transmitting substrate followed by a patterning process. The material for the transparent conductive layer is not particularly limited as long as the material is an electrically conductive material having a light transmittance of about 80% or higher. Examples thereof include ITO, zinc oxide and $SnO_2$. The transparent conductive layer is deposited to a thickness of about 0.1 $\mu$m to about 100 $\mu$m on the substrate by any of various conventional methods such as atmospheric CVD, vacuum CVD, plasma CVD, sputtering and evaporation method. Where an $SnO_2$ film is to be formed by the atmospheric CVD, for example, tin chloride, hydrogen fluoride and steam are supplied at flow rates of about 100,000 sccm to about 500,000 sccm, about 500 sccm to about 3,000 sccm and about 50 sccm to about 500 sccm, respectively, while the substrate is maintained at a temperature not higher than the melting point of the substrate material, preferably at a temperature of 600° C. or lower.

The transparent conductive layer is segmented and patterned by a first scribing step to form the transparent conductive electrodes. The scribing of the transparent conductive layer is achieved by irradiating the transparent conductive layer with any of various types of lasers such as Nd:YAG laser or excimer laser (for example, XeCl) with any wavelength at an intensity such that the light-transmitting substrate or the insulating film formed thereon are not damaged thereby but only the transparent conductive layer is segmented. Here, the Nd:YAG laser is advantageous from an industrial viewpoint because of easy maintenance and low maintenance costs. The wavelength and intensity of the laser beam are controlled depending on the material and the thickness of the transparent conductive layer. Where an $SnO_2$ film of about 1 $\mu$m thickness is formed as the transparent conductive layer, for example, the wavelength and intensity of the laser beam are preferably about 800 nm to about 1400 nm, and about $2 \times 10^4$ W/cm$^2$ to about $5 \times 10^5$ W/cm$^2$, respectively. The segmentation of the transparent conductive layer is preferably carried out in such a manner that the resulting transparent conductive electrodes are arranged into a matrix pattern or in a stripe pattern.

Further, an amorphous semiconductor layer is deposited on the resulting substrate and segmented to form the amorphous semiconductor photoelectric conversion layer on the transparent conductive electrodes. The amorphous semiconductor photoelectric conversion layer preferably includes semiconductor layers comprising a p-layer, an i-layer and an n-layer formed in this order over the transparent conductive electrodes. This ensures that a resulting layer has relatively good photoelectric conversion characteristics. The amorphous semiconductor photoelectric conversion layer may have a structure other than the pin structure. Further, where a single cell structure is employed, a single stack consisting of the p-layer, the i-layer and the n-layer may be provided as the amorphous semiconductor photoelectric conversion layer. Alternatively, a tandem structure may be employed in which the pin structure layers are repeatedly stacked. It is preferred that these semiconductor layers are all amorphous, but the i-layer and the n-layer may be crystalline if at least the p-layer is amorphous. These amorphous semiconductor layers are formed, for example, of silicon, SiC, SiGe, SiSn or the like. The p-layer and the n-layer preferably contain a p-type impurity such as boron and an n-type impurity such as phosphorus or arsenic, respectively, in a concentration of about $10^{18}$ cm$^{-3}$ to about $10^{20}$ cm$^{-3}$. The formation of the p-layer, the i-layer and the n-layer is achieved by any of conventional methods such as atmospheric CVD, vacuum CVD and plasma CVD method. The thickness of the p-layer, the i-layer and the n-layer are about 7 nm to about 12 nm, about 200 nm to about 600 nm and about 20 nm to about 100 nm, respectively, with a total combined thickness of about 200 nm to about 700 nm. The conditions (i.e., frequency, material gas, supply rate, dilution ratio of material gas with hydrogen gas, film formation (RF) energy, film formation temperature and the like) for the CVD method are properly selected.

More specifically, for the formation of the p-layer, a dopant gas such as diborane is supplied at a flow rate of 1 sccm to 100 sccm with the substrate temperature kept at about 150° C. to about 350° C., while a silane gas such as monosilane or disilane and hydrogen gas are supplied at a flow rate ratio of about 3 to about 300 sccm: about 15 to about 1500 sccm. For the formation of the i-layer, a silane gas as described above and hydrogen gas are supplied at a flow rate ratio of about 6 to about 600 sccm: about 2 to about 200 sccm. For the formation of the n-layer, a dopant gas such as phosphine gas is supplied at a flow rate of about 1 sccm to about 100 sccm, while a silane gas as described above and hydrogen gas are supplied at a flow rate ratio of about 6 to about 600 sccm: about 0.3 to about 30 sccm.

The amorphous semiconductor layer is segmented and patterned by a second scribing step. The scribing of the amorphous semiconductor layer is achieved by irradiating the amorphous semiconductor layer with any of various types of lasers such as Nd:YAG laser and excimer laser with any wavelength at an intensity such that only the amorphous semiconductor layer is segmented with the transparent conductive electrodes and the like kept intact. The Nd:YAG laser is advantageous from an industrial viewpoint because of easy maintenance and low maintenance costs. The wavelength and intensity of the laser beam are controlled depending on the material and the thickness of the amorphous semiconductor layer. Where the amorphous semiconductor layer is formed of silicon and has a thickness of about 500 nm, for example, the wavelength and intensity of the laser beam are preferably about 400 nm to about 800 nm, and about $2 \times 10^3$ W/CM$^2$, to about $5 \times 10^4$ W/cm$^2$, respectively. For segmentation of the amorphous semiconductor layer, scribe lines are preferably formed therein in an offset relation with respect to the scribe lines formed through the first scribing step.

Further, a rear electrode layer is deposited on the resulting substrate and patterned to form rear electrodes on the amorphous semiconductor photoelectric conversion layer. The rear electrode layer may be formed by laminating a transparent conductive film and a metal reflection film in this order over the amorphous semiconductor photoelectric conversion layer. Alternatively, the rear electrode layer may be formed of a single layer of metal reflection film. Among these, the laminated layer structure is preferable because it ensures effective utilization of light. The transparent conductive film preferably has a thickness of about 20 nm to about 100 nm, and is formed of the same material and in the same manner as the transparent conductive layer described above. The material for the metal reflection film is not particularly limited, but examples thereof include silver and aluminum. The formation of the transparent conductive film and the metal reflection film is achieved by any of conventional methods such as sputtering and evaporation method.

Above all, it is particularly preferable to form rear electrode layer with silver. Since the reflectivity of silver with respect to the beam of the fourth harmonic generation from the Nd-YAG laser is extremely low (less than 30%), it is possible to utilize most of the energy of the beam in the patterning process. Also, since the reflectivity of a-Si with respect to the laser beam of this wavelength is about 60% and is higher than the reflectivity of silver, the amorphous semiconductor photoelectric conversion layer is not likely to be damaged even if the laser beam is applied onto a-Si of the amorphous semiconductor photoelectric conversion layer exposed by the patterning process. In other words, if the rear electrode layer is formed of silver, the rear electrode layer can be patterned selectively due to a large difference between a processing threshold of the rear electrode layer and a processing threshold of the amorphous semiconductor photoelectric conversion layer The rear electrode layer is preferably formed to have a thickness of 100 nm or more and 550 nm or less. If the thickness of the rear electrode layer lies within the above-mentioned range, it is possible to pattern the rear electrode layer by one application of the laser beam without giving a damage to the amorphous semiconductor photoelectric conversion layer or the other portions of the rear electrode layer. If the thickness of the rear electrode layer is smaller than the above-mentioned range, there is a fear that solar light is not completely reflected, possibly leading to a decrease in photoelectric conversion efficiency.

The rear electrode layer is patterned by means of a third scribing step. The third scribing step may be carried out in the same manner as the first and second scribing steps except that a beam of a fourth harmonic generation (FHG with a wavelength of 0.266 $\mu$m) of the Nd-YAG laser is used.

Being an ultraviolet ray, the beam of the fourth harmonic generation from the Nd-YAG laser severs a metallic bond easily and generates only a small amount of heat. This is preferable because it facilitates a process of patterning the rear electrode layer formed of a metal and there will be less adverse effect by heat on the amorphous semiconductor photoelectric conversion layer and the other portions of the rear electrode layer. Also, since a-Si generally used for the amorphous semiconductor photoelectric conversion layer has a relatively high reflectivity with respect to a beam of an ultraviolet ray, the amorphous semiconductor photoelectric conversion layer is liable to reflect the beam transmitted through the rear electrode back to the rear electrode. Therefore, the amorphous semiconductor photoelectric conversion layer is less likely to be damaged and, further, the beam is more likely to be absorbed by the rear electrode, thereby severing the metallic bond thereof.

The beam of the fourth harmonic generation from the Nd-YAG laser is applied preferably by a single scanning operation. For that purpose, it is preferable to appropriately adjust a repetition frequency, a scanning speed, an intensity and the like depending on a material for the rear electrode. For example, the repetition frequency may be about 1 kHz to about 20 kHz; the scanning speed may be about 10 mm/sec. to about 600 mm/sec.; and the intensity may be about 10 W/mm$^2$ to about 1000 W/mm$^2$.

The beam of the fourth harmonic generation from the Nd-YAG laser to be applied may have a rectangular cross section with a uniform energy density distribution or, alternatively, with an energy density distribution including a sloped portion. A size of the rectangular cross section may be appropriately adjusted depending on a size of the integrated thin film solar cell, a thickness of the rear electrode layer, a size of the rear electrode after the patterning process and the like. The size of the rectangular cross section may be, for example, about 10 $\mu$m to about 100 $\mu$m.

Where the energy density distribution is uniform, the irradiated portion of the rear electrode layer receives energy uniformly, so that it is possible to avoid a case in which only the central portion of the trench receives a large energy. This advantageously achieves an even patterning of the rear electrode layer, and a width of the trench formed in the rear electrode layer is maintained constant from an upper end to the lower end thereof. Also, it is possible to avoid giving a partial damage to a portion of the amorphous semiconductor photoelectric conversion layer under the trench. Further, this provides an advantage that, by a single application of the beam, the trench is formed to have a desired thickness determined by the width of the cross section of the beam.

The method of allowing the above-mentioned beam to have a rectangular cross section with a uniform energy density distribution is not particularly limited, and various methods are available such as using an optical system including a beam expander and a slit, or using a kaleidoscope as described in the later-mentioned Examples. Specifically, it is possible to adopt a method in which a beam emitted by a laser oscillator and having a Gaussian energy density distribution is expanded by the beam expander and a peripheral portion having a low energy density is removed by the slit or the like.

It is preferable to obtain the uniform energy density distribution by selecting wavelengths having an energy density within about ±40% of the desired energy density (an energy density larger than 40% of the maximum energy density).

Here, the beam of the fourth harmonic generation from the Nd-YAG laser may be applied perpendicularly or obliquely to the rear electrode layer. However, if the energy density distribution is uniform as descried above, it is preferable to apply the laser beam obliquely.

If the beam is to be applied obliquely, an incident angle formed between a direction of the applied beam and a scanning direction of the beam is preferably within the range of 0° to about 45°. Thus, it is possible to scan the rear electrode layer in just focus at a front position and in defocus at a rear position relative to the scanning direction if the beam is made inclined as shown above in a plane formed by the scanning direction and the beam in scanning the rear electrode layer with the beam. Since a large amount of energy is received by a position which is in just focus, the patterning is conducted on this position, thereby to expose the amorphous semiconductor photoelectric conversion layer. The position goes out of focus immediately thereafter to reduce the amount of energy received by the position, whereby the shavings of the rear electrode produced by the patterning process are blown away without giving a damage to the exposed amorphous semiconductor photoelectric conversion layer.

Alternatively, if the energy density distribution is to include a sloped portion, it is not preferable to provide an energy density distribution having a large energy density at its center but, rather, it is preferable to realize a slope such that the energy density increases or decreases from one end to the other end of the distribution or such that the energy density gradually increases or decreases from one end to a midway of the distribution and is constant from the midway to the other end.

Here, the sloped portion in the energy density distribution preferably falls between an energy density smaller than the processing threshold of the underlying amorphous semiconductor photoelectric conversion layer and an energy density larger than a vicinity of a cleaning threshold (about ±20% of the cleaning threshold) of the rear electrode layer. More specifically, the slope of the energy density distribution may be appropriately adjusted depending on the thickness and material of the rear electrode layer irradiated by the laser beam and the material of the amorphous semiconductor photoelectric conversion layer. The slope of the energy density distribution may, for example, lie within the range of about 40% to 95% of the maximum energy density (an energy density larger than the cleaning threshold of the rear electrode layer and smaller than the processing threshold of the underlying amorphous semiconductor photoelectric conversion layer).

By scanning the rear electrode layer using the laser beam including the above-described slope with a portion having a larger energy density coming ahead and a portion having a smaller energy density coming behind, it is possible to pattern the rear electrode layer without giving a damage to the exposed amorphous semiconductor photoelectric conversion layer and to blow away the shavings of the rear electrode produced by the patterning process, as shown above.

The method of fabricating an integrated thin film solar cell according to the present invention is hereafter explained with reference to the attached drawings. In the present invention, a beam of a fourth harmonic generation (FHG with a wavelength of 0.266 μm) of an Nd-YAG laser is used for a patterning process (a third scribing step) of the rear electrode layer. The beam of the fourth harmonic generation is obtained by allowing a beam of a fundamental harmonic generation (with a wavelength of 1.064 μm) oscillated by the Nd-YAG laser oscillator to pass through a nonlinear optical crystal to generate a beam of a second harmonic generation (SHG with a wavelength of 0.532 μm) and further allowing the generated a beam of the second harmonic generation to pass through a nonlinear optical crystal.

EXAMPLE 1

Referring to FIG. 1(a), a glass plate having a thickness of 1.1 mm and a refractive index of 1.5 is used as a light-transmitting insulating substrate 1. On one side of the light-transmitting insulating substrate 1, $SiO_2$ having a refractive index of 1.5 is deposited to a thickness of 100 nm by an atmospheric pressure CVD method to form an $SiO_2$ layer 2. At this time, a substrate temperature is maintained at 500° C.

Further, $SnO_2$ is deposited on the $SiO_2$ layer 2 by an atmospheric pressure CVD method to form a transparent conductive electrode layer 3 of a thickness of 1 μm having a texture structure with a haze ratio of 12 to 15%. At this time, the substrate temperature is maintained at 500° C., and $SnCl_4$ at a flow rate of 25 l/min as a material gas, HF at a flow rate of 1 l/min as a dopant gas, and $H_2O$ at a flow rate of 0.2 μl/min for oxidation reaction are supplied. The transparent conductive electrode layer 3 has a sheet resistance of 10 Ω/□.

Figure 1B:
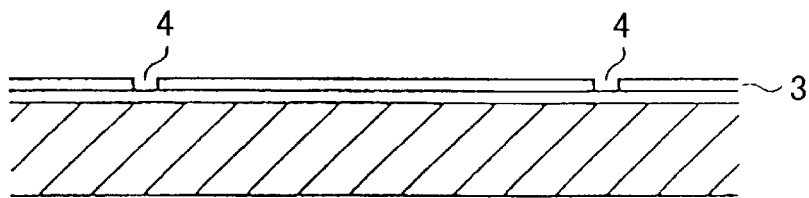

Referring to FIG. 1(b), the transparent conductive electrode layer 3 is then patterned by laser scribing (a first scribing step) to segment it into a plurality of elongate unit cells. Thus, the unit cells are isolated from each other. Specifically, the patterning process is carried out by applying a beam of a fundamental harmonic generation from the Q-switch oscillated Nd-YAG laser with a repetition frequency of 5 kHz, a scanning speed of 200 mm/sec and a surface to be patterned output of 500 W/mm² to form a scribe trench 4 having a width of 50 μm.

Figure 1C:
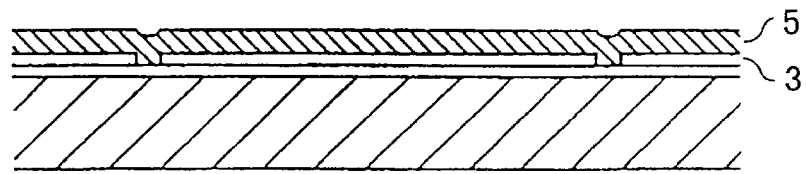

Referring to FIG. 1(c), an amorphous semiconductor photoelectric conversion layer 5 having a three-layer structure of p-, i- and n-layer is then formed on the patterned transparent conductive electrode layer 3. First, the substrate is placed in a plasma CVD apparatus and a p-layer is deposited to a thickness of 12 nm by supplying monosilane gas at a flow rate of 30 sccm, methane gas at a flow rate of 89 sccm, and hydrogen gas at a flow rate of 150 sccm as reactant gases, and diborane gas diluted into a concentration of 1% with hydrogen gas at a flow rate of 10 sccm as a dopant gas while maintaining the substrate temperature to be 200° C.

Subsequently, an i-layer is deposited to a thickness of 400 nm by supplying monosilane gas at a flow rate of 60 sccm and hydrogen gas at a flow rate of 20 sccm as reactant gases while maintaining the substrate temperature to be 200° C. Further, an n-layer is deposited to a thickness of 100 nm by supplying monosilane gas at a flow rate of 60 sccm and hydrogen gas at a flow rate of 3 sccm as reactant gases and phosphine gas diluted into a concentration of 0.3% with hydrogen gas at a flow rate of 18 sccm as a dopant gas while maintaining the substrate temperature to be 200° C.

Figure 1D:
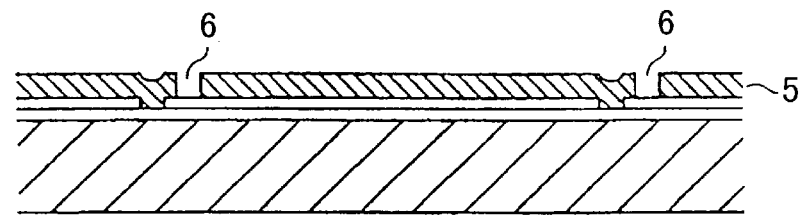
Figure 1E:
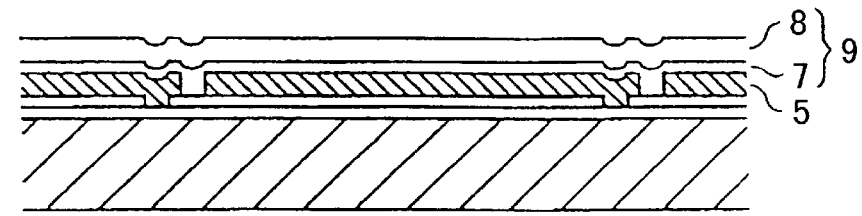

Referring to FIG. 1(d), the amorphous semiconductor photoelectric conversion layer 5 thus formed of a-Si:H is segmented and patterned by laser scribing (second scribing step) at a position shifted in a parallel manner from the first scribe trench 4. The laser beam to be applied in this second scribing step may be any one of the Nd-YAG laser and the excimer laser. In this Example, the Nd-YAG laser is used because of its easy maintenance and low running costs.

Specifically, a beam of a second harmonic generation from the Q-switch oscillation Nd-YAG laser is applied at a repetition frequency of 5 kHz, a scanning speed of 200 mm/sec and a surface to be patterned output of 100 W/mm$^2$ to form a scribe trench 6 having a thickness of 50 μm from the light-transmitting insulating substrate 1 side which does not have the transparent conductive electrode layer 3 or the amorphous semiconductor photoelectric conversion layer 5. Here, FIG. 1(*d*) is given so that the vertical direction of the substrate corresponds to those shown in FIGS. 1(*a*) to 1(*c*) in order to facilitate the understanding of the process flow. In reality, however, the substrate is placed with the amorphous semiconductor photoelectric conversion layer 5 facing downwards and the laser beam is applied from above the substrate. By employing such a process, the amorphous substance subjected to ablation by a laser beam falls down and is removed, so that the amorphous substance does not adhere to the scribe trench 6 again, thus preventing degradation of processing performance.

Referring to FIG. 1(*e*), ZnO is then deposited to a thickness of 35 nm by sputtering method on the patterned amorphous semiconductor photoelectric conversion layer 5 to form a rear transparent conductive film 7. Further, Ag is deposited thereon to a thickness of 500 nm by sputtering method to form a rear metal reflection film 8. The rear transparent conductive film 7 and the rear metal reflection film 8 constitute a rear electrode layer 9.

Referring to FIG. 1(*f*), the rear electrode layer 9 is then segmented and patterned (a third scribing step) by the method of the present invention. Namely, a beam of a fourth harmonic generation 11 of the Nd-YAG laser is applied from the rear metal reflection film 8 side. The laser beam 11 is applied at a position shifted in a parallel manner from the second scribe trench 6 to a side opposite to the first scribe trench 4.

The beam of the fourth harmonic generation from the Q-switch oscillation Nd-YAG laser is applied perpendicularly to the rear metal reflection film 8 at a repetition frequency of 5 kHz, a scanning speed of 125 mm/sec and a surface to be patterned output of 45 W/mm$^2$, or at a repetition frequency of 7 kHz, a scanning speed of 130 mm/sec and a surface to be patterned output of 60 W/mm$^2$. The scanning operation is conducted once. This operation removes Ag of the rear metal reflection film 8 and ZnO of the rear transparent conductive film 7, thereby forming a scribe trench 10 that segments the rear electrode layer 9.

Here, by observation of a relationship between vaporization energy of Ag constituting the rear metal reflection film 8 and an energy of the Nd-YAG laser beam, it is understood that the beam of the fourth harmonic generation from the laser can directly sever the metallic bond of Ag for vaporization thereof because the vaporization energy of Ag—Ag is 2.64 eV/atom and the energy of the beam of the fourth harmonic generation is 4.66 eV. On the other hand, the energies of the conventionally employed the beam of the fundamental harmonic generation and second harmonic generation from the Nd-YAG laser are 1.17 eV and 2.34 eV, respectively, and do not reach the vaporization energy of Ag, so that these waves do not directly sever the metallic bond but vaporize Ag by local heat treatment.

Thus, the beam of the fourth harmonic generation vaporizes Ag by a mechanism different from that of the beam of the fundamental harmonic generation or the second harmonic generation. Also, since the beam of the fourth harmonic generation lies in an ultraviolet ray, it generates less heat, so that there is much less possibility of giving a damage to the amorphous semiconductor photoelectric conversion layer 5 by heat as compared with the beam of the fundamental harmonic generation and the second harmonic generation.

The laser beam to be applied is allowed to have a rectangular cross section with uniform energy density distribution. A device for obtaining the beam of the fourth harmonic generation from the Nd-YAG laser having a rectangular cross section with a uniform energy density distribution is shown by model views in FIGS. 4(*a*) to 4(*d*) together with the energy density distribution of the laser beam.

A beam L of the fourth harmonic generation which has passed two nonlinear optical crystals shows a Gaussian energy density distribution, as illustrated in FIG. 4(*b*). The beam L is expanded by a beam expander 21. The expanded beam is collimated into a parallel beam by a lens 22 and only the center portion of the collimated beam is allowed to pass through a slit 23.

The slit 23 includes four restriction plates movable in a direction perpendicular to the incident beam L, as shown by an arrow. By a rectangular opening formed by these four restriction plates, the beam is allowed to have a rectangular cross section after passing the opening. Each of the restriction plates can be independently located, so that the position of the opening relative to the center line of the incident beam L and the lateral and longitudinal sizes of the opening can be arbitrarily chosen. In this Example, the restriction plates are symmetrically located with respect to the center line of the incident beam L so as to allow the center portion of the beam to pass therethrough without any bias.

After passing the slit 23, the peripheral portion of the beam having a low energy density is removed, and the beam has an energy density distribution having a sharp edge without a broad base, as illustrated in FIG. 4(*c*). The beam is focused onto the rear electrode layer 9 by means of an imaging lens 24 and a condensing lens 25 so that the beam may have a predetermined width. The energy density distribution at the irradiated surface is uniform as illustrated in FIG. 4(*d*).

The size of the beam at the irradiated surface can be arbitrarily adjusted by means of the imaging lens 24 and the condensing lens 25. In this Example, the size of the beam in a direction perpendicular to the scanning direction is set to be 50 μm in order to allow the scribe trench 10 to have a width of 50 μm. Since the laser beam to be applied has an energy density distribution having a sharp edge without a base of low energy density and, moreover, the energy density within the beam is uniform, the irradiated part of the rear electrode layer 9 is processed uniformly, so that the width of the scribe trench 10 is constant from the upper end to the lower end thereof.

Figure 3:
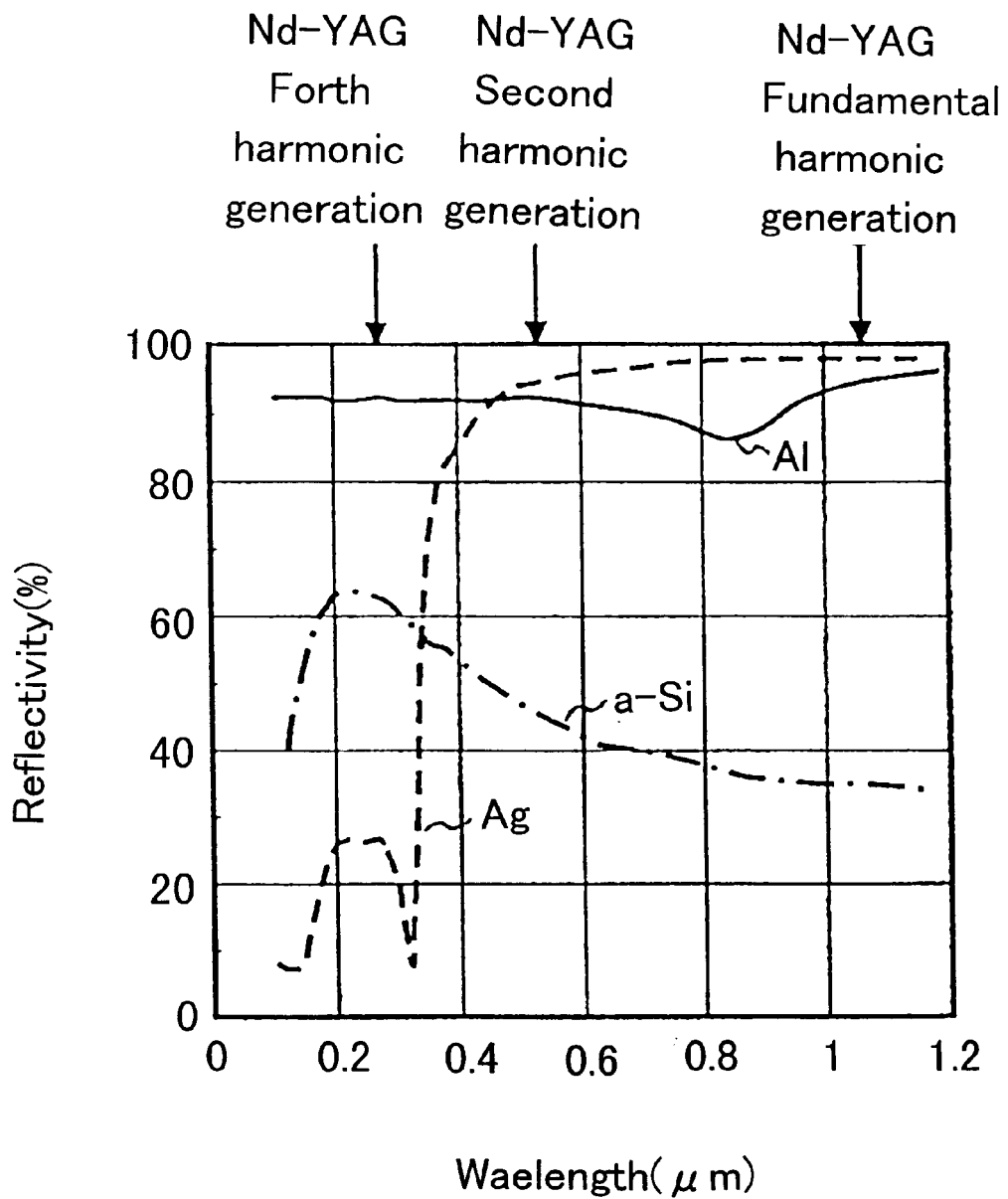
FIG. 3 is a view showing a relationship between a wavelength of a laser beam and reflectivity of metals and an amorphous semiconductor.

The material a-Si:H that forms the amorphous semiconductor photoelectric conversion layer 5 lying under the rear electrode layer 9 shows a large reflectivity of 60% or more with respect to the beam of the fourth harmonic generation from the Nd-YAG laser as illustrated in FIG. 3, so that the laser beam transmitted through the rear electrode layer 9 tends to be reflected back to the rear electrode layer 9 by the amorphous semiconductor photoelectric conversion layer 5. Therefore, most of the energy of the laser beam is utilized for the processing of the rear electrode layer 9 and, further, the amorphous semiconductor photoelectric conversion layer 5 is less likely to be damaged. Moreover, since the energy density distribution of the applied laser beam is uniform, it is possible to avoid a case in which the amorphous semiconductor photoelectric conversion layer 5 at the center portion of the trench is damaged by excessive application of energy.

Figure 1F:
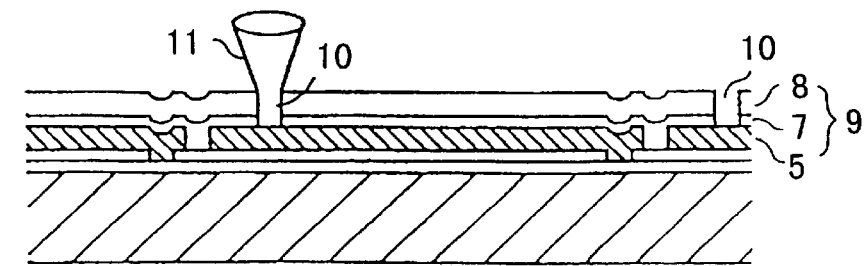

Thus, the rear electrode layer 9 is segmented to complete the integrated thin film solar cell in which a plurality of unit cells are connected in series, as shown in FIG. 1(f). A rear electrode separation resistance in a current application reverse bias direction in the integrated thin film solar cell thus fabricated showed a value of 15 kΩ or more.

The characteristics of the integrated thin film solar cell of 300×300 mm manufactured by the method of this Example showed a short circuit current of 0.522 A, an open circuit voltage of 26.4 V, a curve factor of 0.72 and a conversion efficiency of 11% at AM1.5 (100 mW/cm$^2$).

By employing a method of enlarging the beam with a beam expander and allowing only the central portion of the beam to pass through the slit as described above, it is possible to obtain a beam having an energy density distribution which is uniform also from a microscopic point of view, as compared with a later-mentioned method of using a kaleidoscope. Therefore, it is possible to avoid giving a damage to the amorphous semiconductor photoelectric conversion layer or the like in segmenting the rear electrode layer by only taking the processing thresholds and the average energy of the laser beam.

EXAMPLE 2

Figure 5A:
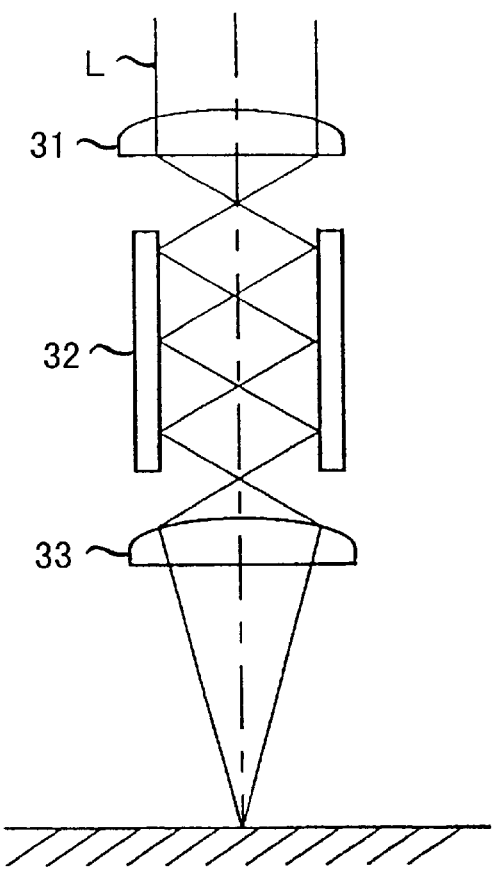
FIG. 5(a) is a model view showing another process of generating a beam of a fourth harmonic generation from an Nd-YAG laser having a rectangular cross section with a uniform energy density distribution by means of a kaleidoscope.
Figure 5B:
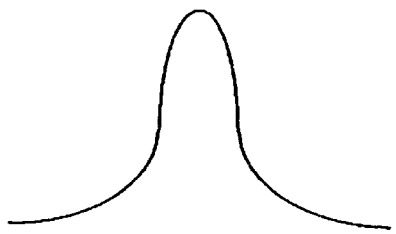
FIG. 5(b) to FIG. 5(c) are views showing an energy density distribution of the laser beam shown in FIG. 5(a)
Figure 5C:
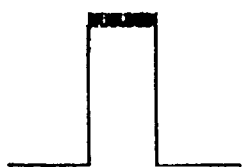

Here, an example is given in which a kaleidoscope is used instead of a combination of a beam expander and a slit used in Example 1 in order to obtain a laser beam having a rectangular cross section with a uniform energy density distribution. FIGS. 5(a) to 5(c) are model views showing a construction in which the kaleidoscope is used and an energy density distribution of the laser beam.

Referring to FIG. 5(a), a beam is directed by a spherical lens 31 into a tubular kaleidoscope 32 formed of four inner mirrors, and the beam having passed the kaleidoscope is focused onto a surface to be patterned by a spherical lens 33. Referring to FIG. 5(b), the beam L having a Gaussian energy density distribution is multiply reflected between the inner mirrors of the kaleidoscope 32 to form a beam having a rectangular cross section with an energy density distribution having a sharp edge without a broad base, as shown in FIG. 5(c). Also, the energy difference between the central portion and the peripheral portion of the beam is small and the beam is uniform from a macroscopic point of view.

However, as shown in FIG. 5(c), the energy density distribution of the laser beam obtained by a kaleidoscope is non-uniform (uneven) from a microscopic point of view due to an interference effect. As the number of beam reflections at the inner mirrors increase, the energy density distribution becomes more uniform from the macroscopic point of view, but the non-uniformity of the energy density distribution increases from the microscopic point of view owing to the increased interference effect. A needle-like peak of the energy density distribution may sometimes exceed the processing threshold of the amorphous semiconductor photoelectric conversion layer or the transparent electrode film layer lying thereunder, whereby a damage is given to these layers. This renders it necessary to pay attention to a relationship between the processing thresholds and the microscopic non-uniformity of the energy density distribution.

EXAMPLE 3

In this Example, the amorphous semiconductor photoelectric conversion layer is formed in a double stack to provide an integrated thin film solar cell having a tandem structure. FIGS. 2(a) to 2(d) are views showing the manufacturing steps for this structure. The steps until the transparent conductive electrode layer 3 is formed on the light-transmitting insulating substrate 1 and the step of segmenting and patterning the transparent conductive electrode layer 3 (the first scribing step) are the same as in the Example 1, and an explanation therefor is omitted.

Figure 2A:
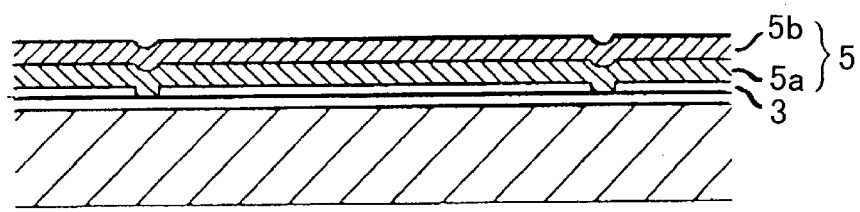
FIGS. 2(a) to 2(d) are views showing cross sections of an integrated thin film solar cell for explaining a manufacturing process according to another embodiment of the present invention.

Referring to FIG. 2(a), an amorphous semiconductor photoelectric conversion layer 5a of a first stack having a three-layer structure of p, i, n is formed on a patterned transparent conductive electrode layer 3. First, a substrate is placed in a plasma CVD apparatus, and a p-layer is deposited to a thickness of 10 nm by supplying monosilane gas at a flow rate of 30 sccm, methane gas at a flow rate of 35.6 sccm, hydrogen gas at a flow rate of 160 sccm as reactant gases, and diborane gas diluted into a concentration of 0.6% with hydrogen gas at a flow rate of 0.06 sccm as a dopant gas while maintaining the substrate temperature to be 200° C. At this time, the reaction pressure is 0.32 Torr.

Subsequently, an i-layer is deposited to a thickness of 130 nm by supplying monosilane gas at a flow rate of 60 sccm and hydrogen gas at a flow rate of 20 sccm as reactant gases while maintaining the substrate temperature to be 200° C. At this time, the reaction pressure is 0.12 Torr. Further, an n-layer is deposited to a thickness of 100 nm by supplying monosilane gas at a flow rate of 60 sccm, hydrogen gas at a flow rate of 20 sccm as reactant gases, and phosphine gas diluted into a concentration of 2% with hydrogen gas at a flow rate of 0.35 sccm as a dopant gas while maintaining the substrate temperature to be 200° C.

Further, an amorphous semiconductor photoelectric conversion layer 5b of a second stack having a similar three-layer structure of p, i, n is formed on the amorphous semiconductor photoelectric conversion layer 5a thus deposited. The condition of depositing the p-layer and the i-layer is the same as in the first stack. The n-layer is formed by supplying monosilane gas at a flow rate of 30 sccm, hydrogen gas at a flow rate of 160 sccm as reactant gases, and phosphine gas diluted into a concentration of 0.6% with hydrogen gas at a flow rate of 10 sccm as a dopant gas. The n-layer is deposited to a thickness of 100 nm, and the reaction pressure at the time of deposition is 0.32 Torr. This completes the amorphous semiconductor photoelectric conversion layer 5 having a tandem structure.

Figure 2B:
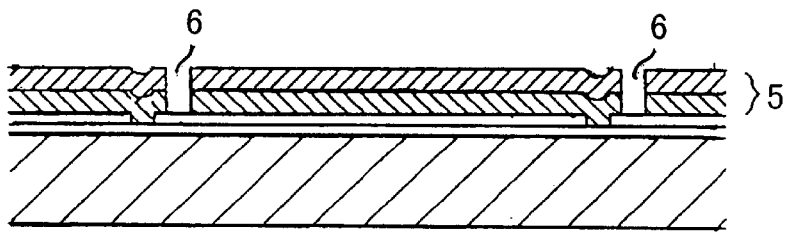
Figure 2C:
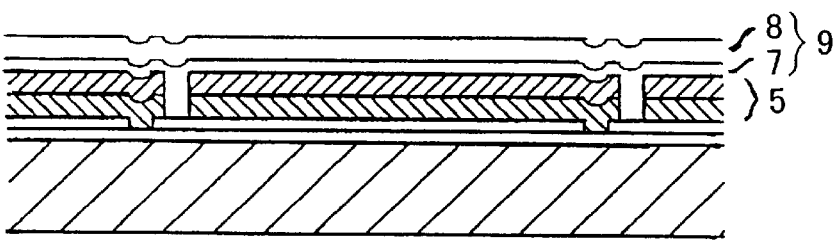
Figure 2D:
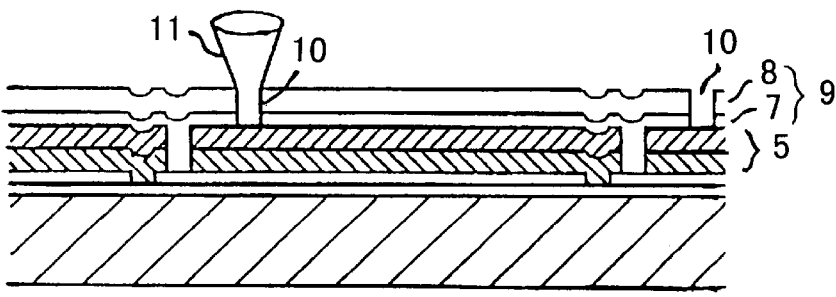

Thereafter, the amorphous semiconductor photoelectric conversion layer 5 is segmented and patterned (the second scribing step) in the same manner as in the Example 1, as shown in FIG. 2(b). Then, a rear transparent conductive film 7 made of ZnO and a rear metal reflection film 8 made of Ag are deposited to form a rear electrode layer 9, as shown in FIG. 2(c). Further, the rear electrode layer 9 is segmented and patterned (the third scribing step) by applying the beam of the fourth harmonic generation from the Nd-YAG laser having a rectangular cross section with uniform energy density distribution from the rear metal reflection film 8 side under the same condition as in the Example 1 by employing a method shown in FIG. 4, thereby completing the integrated thin film solar cell shown in FIG. 2(d).

The characteristics of the integrated thin film solar cell of 300×300 mm manufactured by the method of this Example and having a double-stack tandem structure showed a short circuit current of 0.309 A, an open circuit voltage of 44.4 V, a curve factor of 0.72 and a conversion efficiency of 11% at AM1.5 (100 mW/cm$^2$).

EXAMPLE 4

Figure 4A:
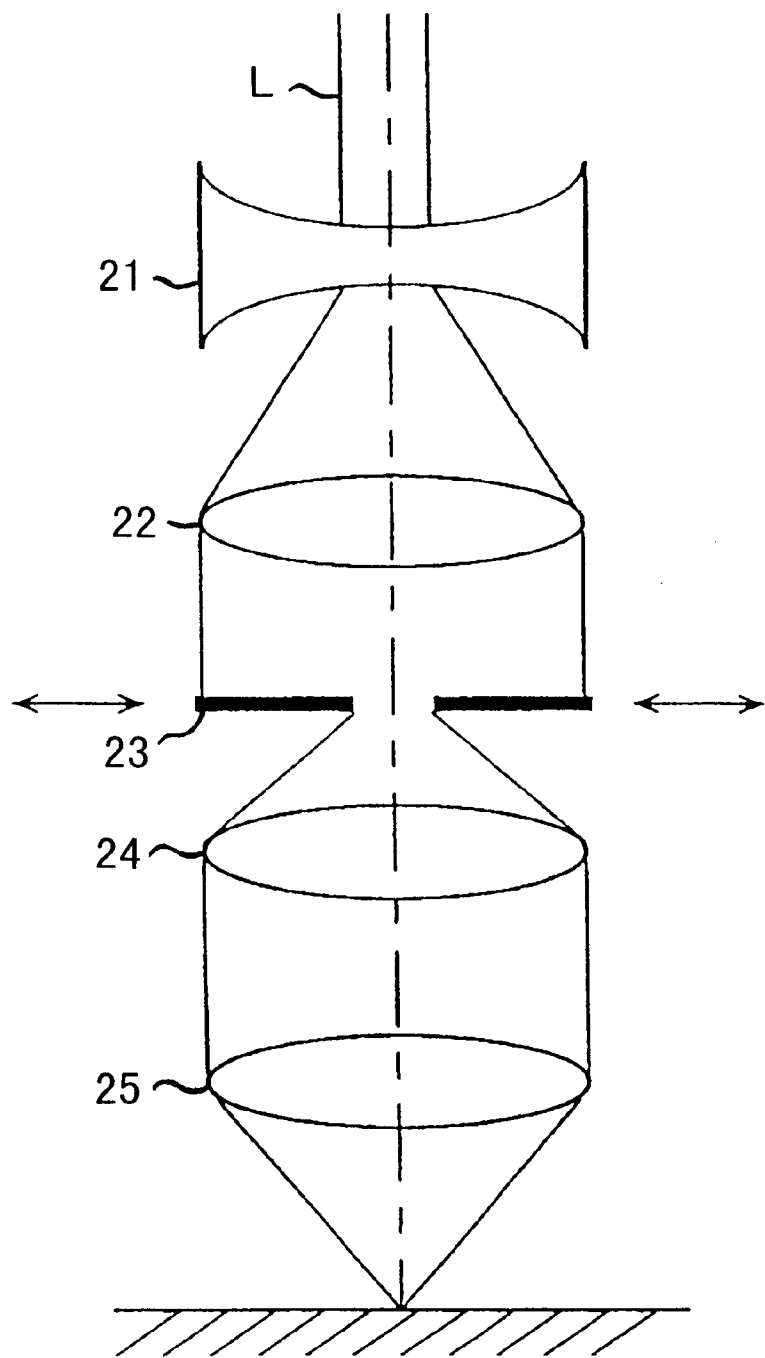
FIG. 4(a) is a model view showing a process of generating a beam of a fourth harmonic generation from an Nd-YAG laser having a rectangular cross section with a uniform energy density distribution.
Figure 4B:
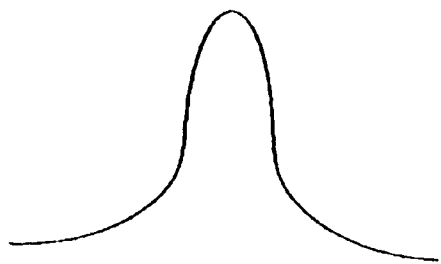
FIG. 4(b) to FIG. 4(d) are views showing an energy density distribution of the laser beam shown in FIG. 4(a)
Figure 4C:
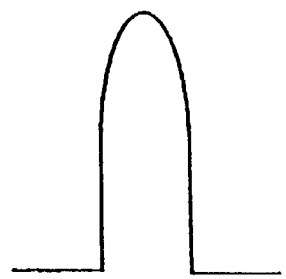
Figure 4D:
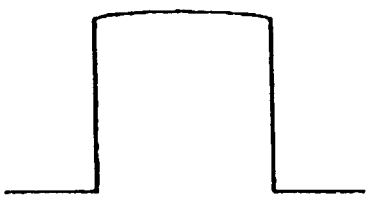

In the above-described Examples 1 and 3, the rear electrode layer was segmented and patterned (the third scribing step) by applying a laser beam having a uniform energy density distribution shown in FIG. 4(d). The Example 4, however, utilizes a laser beam with an energy density distribution including a sloped portion. The integrated thin film solar cell to be manufactured has a single amorphous semiconductor photoelectric conversion layer, and the steps until the formation of the rear electrode layer 9 are carried out in the same manner as in the Example 4.

Figure 6A:
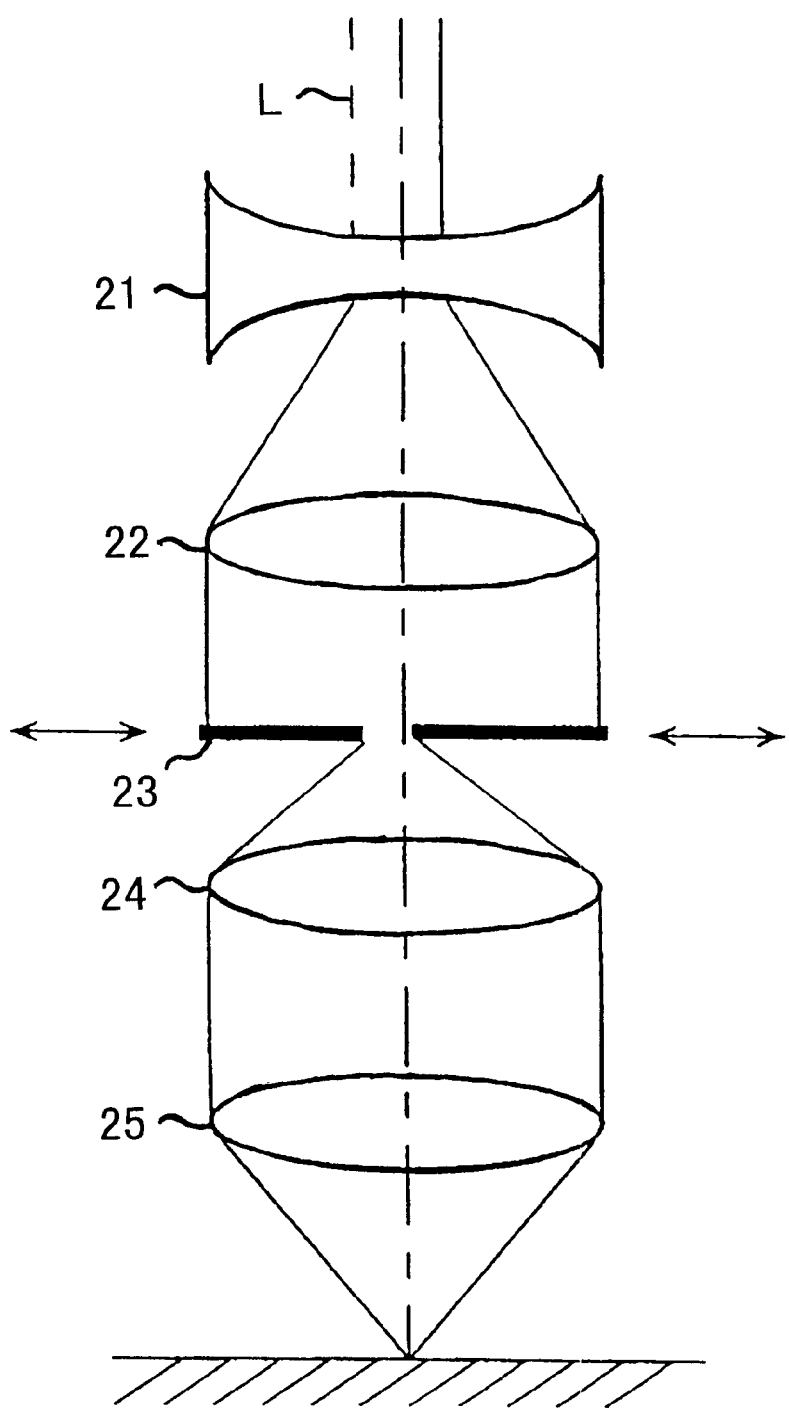
FIG. 6(a) is a model view showing a process of generating a beam of a fourth harmonic generation from an Nd-YAG laser having a rectangular cross section with an energy density distribution including a sloped portion.
Figure 6:
FIG. 6(b) to FIG. 6(d) are views showing an energy density distribution of the laser beam shown in FIG. 6(a)

A device for obtaining the beam of the fourth harmonic generation from the Nd-YAG laser having a rectangular cross section with an energy density distribution including a sloped portion, which is to be used in the process of segmenting and patterning the rear electrode layer 9 (the third scribing step), is shown by model views in FIGS. 6(a) to 6(d) together with the energy density distribution of the laser beam. The construction shown in FIG. 6(a) is approximately the same as that of FIG. 4(a). However, in this Example, a pair of opposing restriction plates in the four restriction plates of the slit 23 are not placed symmetrically with respect to the center line of the incident beam L but are placed at an offset (biased) position. The other pair of opposing restriction plates are placed symmetrically with respect to the center line of the incident beam L.

Figure 6C:
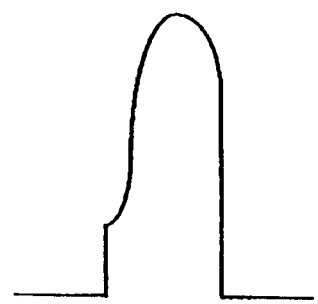

The beam expanded by the beam expander 21 is allowed to pass through the opening of the slit 23 to form a beam having a rectangular cross section. However, the energy density distribution of the laser beam which has passed through the slit 23 is unsymmetrical as shown in FIG. 6(c), since the restriction plates are placed unsymmetrically to allow a portion of the incident laser beam L lying inside the dashed lines shown in FIG. 6(b) to pass through the slit 23. Here, the broad base portion (low energy portion) of the incident laser beam L is removed to form a beam having a clear boundary.

Figure 6D:
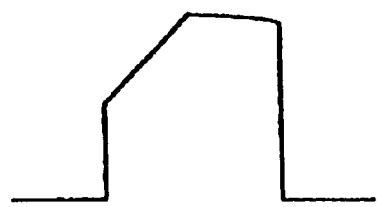

This beam is focused onto the rear electrode layer 9 by an imaging lens 24 and a condensing lens 25 so that the beam may have a predetermined width. This allows the energy density distribution of the laser beam at the irradiated surface to be partly uniform and partly sloped along one direction, as shown in FIG. 6(d). The energy density distribution along a direction perpendicular to the above direction is uniform.

Figure 7:
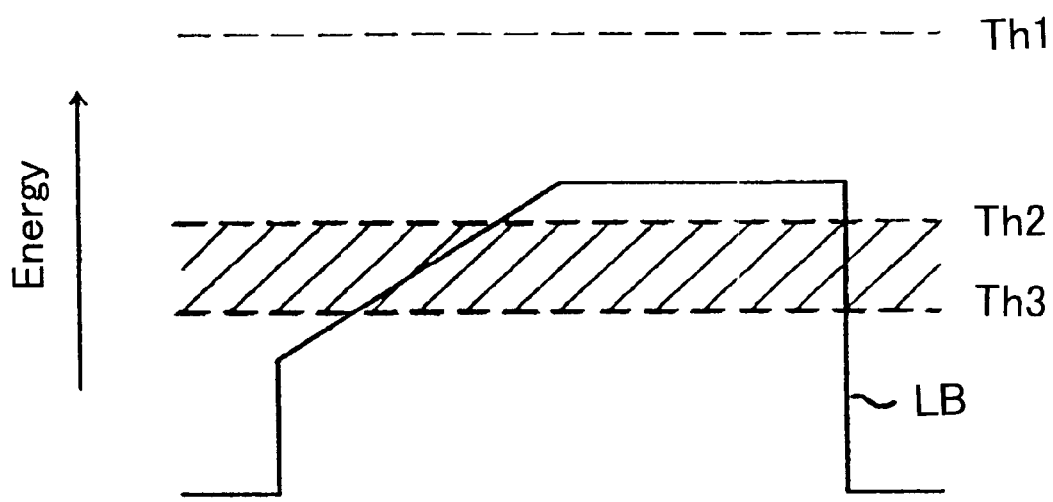
FIG. 7 is a view showing a principle of patterning a rear electrode layer by means of a laser beam with an energy distribution including a sloped portion.

The principle of segmenting and patterning the rear electrode layer according to this Example is shown in FIG. 7. Referring to FIG. 7, LB represents an energy profile of the applied laser beam. The symbol Th1 represents a processing threshold of the amorphous semiconductor photoelectric conversion layer 5; Th2 is a processing threshold of the rear electrode layer 9; and Th3 is a cleaning threshold of the rear electrode layer 9.

Since the processing threshold Th1 of the amorphous semiconductor photoelectric conversion layer comprising a-Si:H is higher than the processing threshold Th2 of the rear electrode layer comprising Ag, it is possible to process the rear electrode layer selectively by setting the maximum energy of the applied laser beam to lie between the two thresholds Th1 and Th2. Also, since the cleaning threshold Th3 of the rear electrode layer is lower than the processing threshold Th2 of the rear electrode layer, it is possible to blow away the shavings produced by the processing the rear electrode layer without further processing by applying a laser beam having an energy density lying within the hatched area from Th3 to Th2.

In scanning the rear electrode layer 9, a portion of the laser beam which has a large energy density and which is uniform is allowed to come ahead in the scanning direction. By setting the scanning direction in this way, it is possible to realize that the rear electrode layer 9 first receives a laser beam having a relatively high energy density and then receives a laser beam having a gradually decreasing energy density. Therefore, the rear electrode layer 9 is processed by a laser beam having a relatively high energy density, thereby forming a scribe trench 10. Moreover, shavings of Ag and ZnO produced by processing the rear electrode layer 9 are immediately blown away by the laser beam having a relatively low energy density and do not adhere to the scribe trench 10 again. Accordingly, the segmented and patterned portions in the rear electrode layer 9 are not electrically connected with each other, so that no electric short circuit is generated.

Furthermore, the amorphous semiconductor photoelectric conversion layer 5 exposed by the formation of the scribe trench 10 is not directly processed by application of the laser beam because the processing threshold Th1 of the amorphous semiconductor photoelectric conversion layer 5 is higher than the energy density of any portion of the laser beam. Moreover, at the time when the amorphous semiconductor photoelectric conversion layer 5 is exposed, the energy density of the laser beam applied thereto is reduced, so that the temperature rise is small and little damage is given by heat.

The laser beam is applied to the rear electrode layer 9 at a repetition frequency of 5 kHz, a scanning speed of 125 mm/sec and a surface to be patterned output of 45 W/mm$^2$, or at a repetition frequency of 7 kHz, a scanning speed of 130 mm/sec and a surface to be patterned output of 60 W/mm$^2$. The scribe trench is allowed to have a width of 50 μm.

A separation resistance in a current application reverse bias direction in the rear electrode layer 9 thus segmented showed a value of 20 kΩ or more. The characteristics of the integrated thin film solar cell of 300×300 mm manufactured by the method of the present invention showed a short circuit current of 0.522 A, an open circuit voltage of 26.4 V, a curve factor of 0.72 and a conversion efficiency of 11% at AM1.5 (100 mW/cm$^2$).

EXAMPLE 5

The method for segmenting and patterning the rear electrode layer by using the beam of the fourth harmonic generation from the Nd-YAG laser with an energy density distribution including a sloped portion may be applied to the process of manufacturing an integrated thin film solar cell of a tandem structure having an amorphous semiconductor photoelectric conversion layer in double stack.

The steps up to the formation of the rear electrode layer 9 were conducted in the same manner as in the Example 3, and the rear electrode layer 9 was segmented and patterned as in the Example 4. The characteristics of the integrated thin film solar cell of 300×300 mm having a tandem structure manufactured in this Example showed a short circuit current of 0.309 A, an open circuit voltage of 44.4 V, a curve factor of 0.72 and a conversion efficiency of 11% at AM1.5 (100 mW/cm$^2$).

EXAMPLE 6

In the Examples 1 and 3, the rear electrode layer was segmented and patterned (the third scribing step) by applying a laser beam having a uniform energy density distribution perpendicularly to the rear electrode layer. In this Example 6, the laser beam having a uniform energy density distribution is applied obliquely to the rear electrode layer.

The integrated thin film solar cell manufactured in this Example has a single amorphous semiconductor photoelectric conversion layer 5, and the steps up to the formation of the rear electrode layer 9 are conducted in the same manner as in the Example 1. Also, the beam of the fourth harmonic generation from the Nd-YAG laser beam to be applied is allowed to have a rectangular cross section with a uniform energy density distribution in the same manner as in the Example 1.

In processing the rear electrode layer 9, a processing stage holding the light-transmitting insulating substrate 1 is inclined in X or Y direction, and the rear electrode layer 9 is scanned by applying the laser beam in a slope direction with the laser beam inclined with respect to the X-Y plane. Here, the imaging location of the laser beam is set so that the irradiated part comes in just focus at a front position thereof and comes in defocus at a rear position thereof in a scanning direction. The setting is maintained while scanning in one direction.

Figure 8A:
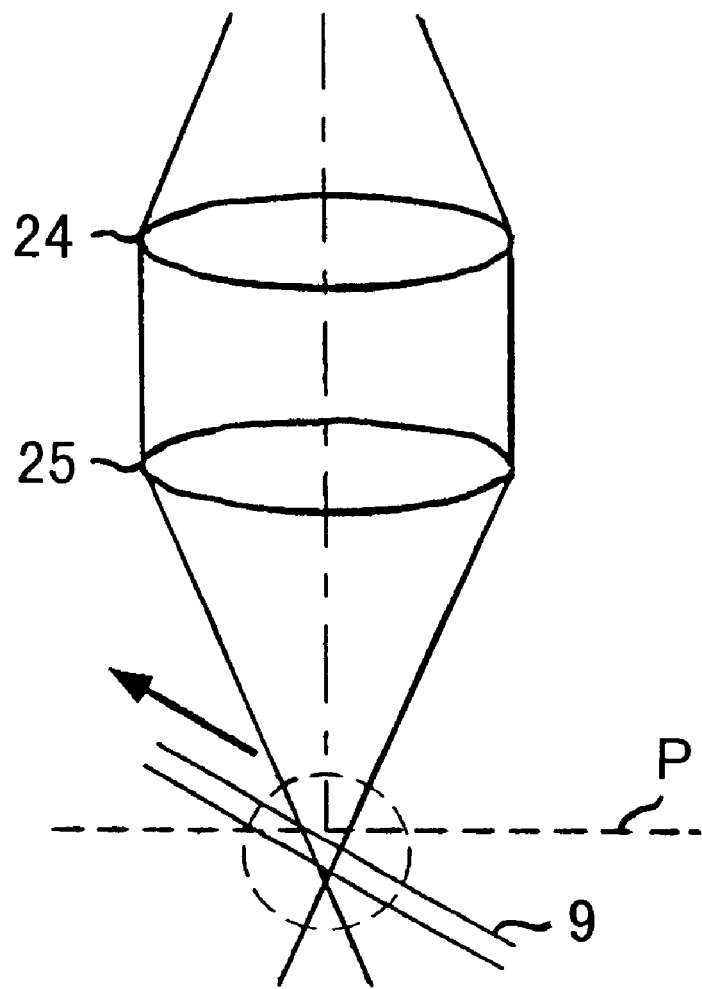
FIGS. 8(a) to 8(d) are views showing an example of setting a focusing position in a method of patterning a rear electrode layer by obliquely applying a laser beam having a uniform energy density distribution.
Figure 8B:
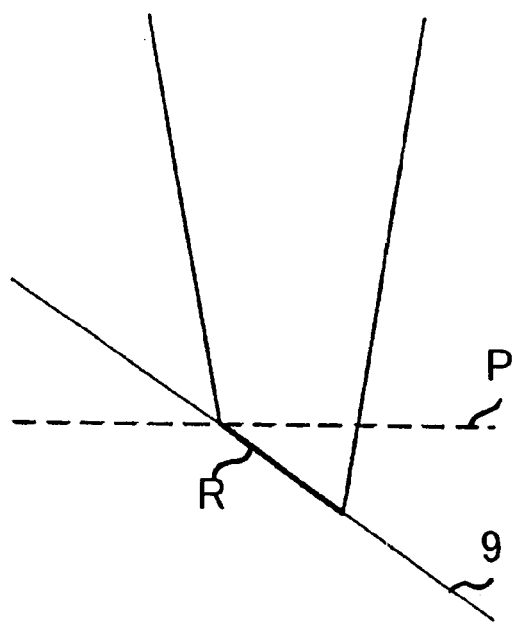
Figure 8C:
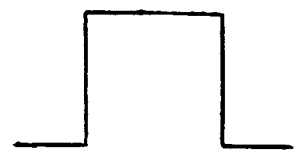
Figure 8D:

FIG. 8(a) to 8(d) are views showing a case in which the laser beam is moved from a lower side to a higher side of the processing stage. FIG. 8(a) shows a relationship between the laser beam and the rear electrode layer 9; FIG. 8(b) is an enlarged view of an encircled part in FIG. 8(a); FIG. 8(c) shows an energy density distribution of the laser beam in the imaging plane P; and FIG. 8(d) shows an energy density distribution on the rear electrode layer 9.

The laser beam is positioned by the imaging leans 24 and the condensing lens 25 so that the imaging plane P coincides with the upper end of the irradiated part R. The energy density of the laser beam on the surface of the irradiated part R of the rear electrode layer 9 attains the maximum value at the upper end which is in just focus, and gradually decreases according as the position on the rear electrode layer is away from the imaging plane P to increase the defocusing degree, as shown in FIG. 8(d).

By moving the laser beam in a direction parallel to the rear electrode layer 9 and indicated by an arrow in FIG. 8(a) while maintaining this state, the rear electrode layer 9 is processed by a front side portion of the laser beam (relative to the scanning direction) having a relatively high energy density, and the shavings of Ag and ZnO produced by the processing are blown away by a rear side portion of the laser beam (relative to the scanning direction) having a relatively low energy density. Accordingly, this produces approximately the same phenomenon as in the Example 3 in which the laser beam having a sloped energy density distribution is applied perpendicularly to the rear electrode layer 9, thereby preventing re-adhesion of the shavings onto the scribe trench 10 and avoiding generation of an electric short circuit in the segmented rear electrode layer 9.

Where the laser beam is to be moved from the higher side to the lower side of the processing stage, the imaging plane P of the laser beam is allowed to coincide with the lowermost end of the irradiated part R. In this Example, the computer for controlling the focusing adjustment, scanning direction, scanning speed and the like of the laser beam is programmed to enable switching of the position of the imaging plane P of the laser beam in accordance with the scanning direction. Therefore, the processing stage is scanned back and forth between the higher side and the lower side thereof with the front portion of the irradiated part (relative to the scanning direction) being always in just focus.

The inclination angle of the processing stage is adjusted by considering a processing depth of the laser beam in the rear electrode layer 9. For example, the inclination angle of the processing stage may be set at a value of 45° or less in the case where the processing depth of the laser beam with respect to Ag is about ±600 µm of the just-focus position and the size of the laser beam at the imaging plane is 30 µm. This achieves a good processing performance.

A separation resistance in a current application reverse bias direction showed a value of 20 kΩ or more when a scribe trench having a width of 50 µm was formed by applying a laser beam at a repetition frequency of 5 kHz, a scanning speed of 125 mm/sec and a surface to be patterned output of 45 W/mm$^2$, or at a repetition frequency of 7 kHz, a scanning speed of 130 mm/sec and a surface to be patterned output of 60 W/mm$^2$. The characteristics of the integrated thin film solar cell of 300×300 mm manufactured according to the method of this Example were almost the same as those of the integrated thin film solar cell of the Example 3.

In this Example, the laser beam is moved to scan the rear electrode layer 9. Alternatively, however, it is also possible to move the processing stage without moving the laser beam. Also, it is possible to apply the laser beam obliquely to the rear electrode layer 9 by changing the direction of the laser beam instead of inclining the processing stage. These alternatives are, in principle, the same as the method of this Example and may be suitably selected by taking into account the apparatus construction and the like.

EXAMPLE 7

The method of applying a laser beam having a uniform energy density distribution obliquely to the rear electrode layer may also be used in manufacturing an integrated thin film solar cell of a tandem structure having an amorphous semiconductor photoelectric conversion layer in double stack.

The steps up to the formation of the rear electrode layer 9 were conducted in the same manner as in the Example 3, and the rear electrode layer 9 was segmented and patterned as in the Example 6. The characteristics of the integrated thin film solar cell of 300×300 mm having a tandem structure manufactured in this Example showed a short circuit current of 0.309 A, an open circuit voltage of 44.4 V, a curve factor of 0.72 and a conversion efficiency of 11% at AM1.5 (100 mW/cm$^2$).

EXAMPLE 8

In order to find a range of application of the present invention, several experiments of segmenting and patterning the rear electrode layer were conducted using the beam of the fourth harmonic generation from the Nd-YAG laser with varying laser parameters (such as surface to be patterned output, scanning speed, Q frequency and imaging size) and with varying thickness of the rear electrode layer. It is found out that the rear electrode layer can be effectively segmented by a single application of the laser beam if the thickness of the rear electrode layer falls within a range of 600 nm or less, which range is generally set for an ordinary integrated thin film solar cell. However, if the thickness of the rear electrode layer is too small, the solar light is transmitted therethrough to decrease the photoelectric conversion efficiency. Therefore, the rear electrode layer is preferably formed to have a thickness of 100 nm or more to completely reflect the solar light.

By employing the method of manufacturing an integrated thin film solar cell according to the present invention, it is possible to segment and pattern the rear electrode layer easily with little damage given by heat because the metallic bond in the rear electrode layer is easily severed with only a small generation heat. Moreover, damage of the amorphous semiconductor photoelectric conversion layer caused by direct application of the laser beam is alleviated. This enables fabrication of a good integrated thin film solar cell having no electric severing or short circuit with good reproducibility. Also, since the Nd-YAG laser is a solid laser, it is easy to handle it as compared with the excimer laser which has a similar wavelength but employs a gas, so that the apparatus construction is simple and the running costs can be reduced.

Where the rear electrode layer is formed of silver, most of the energy can be utilized for the patterning process because reflection of the laser beam at the rear electrode layer is little. This provides good efficiency. Therefore, it is possible to segment and pattern the rear electrode layer securely by a single application of the laser beam, thereby preventing a case in which the amorphous semiconductor photoelectric conversion layer or the rear electrode layer is damaged by multiple applications of the laser beam. Also, since there is a great difference between the processing threshold of the rear electrode layer and the processing threshold of the amorphous semiconductor photoelectric conversion layer, it is possible to perform a selective patterning process in which only the rear electrode layer is patterned, thereby further reducing the damage given to the amorphous semiconductor photoelectric conversion layer. Therefore, a high-quality integrated thin film solar cell having no electric short circuit or the like can be manufactured in a stable manner.

Where the rear electrode layer is formed to have a thickness of 100 nm to 550 nm, the rear electrode layer can be patterned by a single application of the laser beam, thereby preventing a bad influence caused by multiple applications of the laser beam. Moreover, since the solar light is completely reflected by the rear electrode layer, an integrated thin film solar cell having a good photoelectric conversion efficiency can be obtained.

Where the beam of the fourth harmonic generation from the Nd-YAG laser has a rectangular cross section with a uniform energy density distribution, the rear electrode layer can be partitioned with a trench having a constant width from the upper end to the lower end thereof, so that an electric short circuit is hardly generated between the segmented portions in the rear electrode layer. Also, it is possible to prevent a case in which the amorphous semiconductor photoelectric conversion layer under the trench is damaged by a laser beam having a non-uniform energy density distribution. Moreover, since a trench having a desired width can be formed in the rear electrode layer by a single application of the laser beam, it is unnecessary to apply the laser beam plural times and it is possible to prevent a case in which the amorphous semiconductor photoelectric conversion layer is damaged by being partially irradiated with the laser beam plural times. Therefore, a high-quality integrated thin film solar cell having no electric short circuit or the like can be manufactured in a stable manner.

Where the beam of the fourth harmonic generation from the Nd-YAG laser is applied obliquely onto the rear electrode layer, adhesion of the shavings of the rear electrode layer produced by the patterning process can be prevented, and generation of electric short circuit between the segmented portions in the rear electrode layer is prevented with more certainty. Further, no damage is given to the amorphous semiconductor photoelectric conversion layer.

Where the beam of the fourth harmonic generation from the Nd-YAG laser has a rectangular cross section with an energy density distribution including a sloped portion, an electric short circuit between the segmented portions in the rear electrode layer, which is caused by adhesion of the shavings of the rear electrode layer to the trench, is firmly prevented without giving a damage to the amorphous semiconductor photoelectric conversion layer.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A method of fabricating an integrated thin film solar cell, comprising the steps of:

forming a transparent conductive electrode and an amorphous semiconductor photoelectric conversion layer successively on a light-transmitting substrate;

forming a rear electrode layer on the amorphous semiconductor photoelectric conversion layer; and patterning the rear electrode layer by applying a beam of a fourth harmonic generation from an Nd-YAG laser onto the rear electrode layer to form a rear electrode, wherein the photoelectric conversion layer is in contact with said rear electrode layer at the location of said patterning.

2. A method according to claim 1, wherein the patterning of the rear electrode layer is performed through applying the beam of the fourth harmonic generation from the Nd-YAG laser by a single scanning operation at an energy density such that the rear electrode layer is patterned without giving a damage to the amorphous semiconductor photoelectric conversion layer.

3. A method according to claim 1, wherein the rear electrode layer is formed of silver.

4. A method according to claim 1, wherein the rear electrode layer is formed to a thickness of about 100 nm to about 550 nm.

5. A method according to claim 1, wherein the beam of the fourth harmonic generation from the Nd-YAG laser has a rectangular cross section with a uniform energy density distribution.

6. A method according to claim 5, wherein the beam of the fourth harmonic generation from the Nd-YAG laser is allowed to have the rectangular cross section with a uniform energy density distribution by enlarging the beam having a Gaussian distribution and removing a peripheral portion of the enlarged beam.

7. A method according to claim 6, wherein the removal of the peripheral portion of the enlarged beam having the Gaussian distribution is performed by selection of a beam portion having an energy density within about ±40% of a predetermined energy density.

8. A method according to claim 1, wherein the beam of the fourth harmonic generation from the Nd-YAG laser is obliquely applied onto the rear electrode layer.

9. A method according to claim 8, wherein the beam of the fourth harmonic generation from the Nd-YAG laser is applied so that an incident angle of the beam relative to a scanning direction of the beam is within a range of 0° to about 45°.

10. A method according to claim 1, wherein the beam of the fourth harmonic generation from the Nd-YAG laser has a rectangular cross section with an energy density distribution including a sloped portion.

11. A method according to claim 10, wherein the sloped portion in the energy density distribution lies between an energy density smaller than the processing threshold of the amorphous semiconductor photoelectric conversion layer and an energy density larger than a vicinity of a cleaning threshold of the rear electrode layer.

* * * * *